US011382231B2

(12) United States Patent
Tsuji et al.

(10) Patent No.: US 11,382,231 B2
(45) Date of Patent: Jul. 5, 2022

(54) SOCKET CONNECTOR AND CABLE ASSEMBLY FOR A COMMUNICATION SYSTEM

(71) Applicants: TYCO ELECTRONICS JAPAN G.K., Kawasaki (JP); TE Connectivity Services GmbH, Schaffhausen (CH)

(72) Inventors: Junya Tsuji, Machida (JP); Katsuhiko Kobayashi, Tama (JP); Christopher William Blackburn, Bothell, WA (US)

(73) Assignees: Tyco Electronics Japan G.K., Kawasaki (JP); TE Connectivity Services GmbH, Schaffhausen (CH)

( * ) Notice: Subject to any disclaimer, the term of this patent is extended or adjusted under 35 U.S.C. 154(b) by 152 days.

(21) Appl. No.: 16/863,426

(22) Filed: Apr. 30, 2020

(65) Prior Publication Data
US 2021/0345506 A1 Nov. 4, 2021

(51) Int. Cl.
H05K 7/10 (2006.01)
G01R 1/04 (2006.01)
H01R 12/70 (2011.01)
H05K 1/18 (2006.01)
H01R 13/24 (2006.01)

(52) U.S. Cl.
CPC ......... *H05K 7/1069* (2013.01); *G01R 1/0466* (2013.01); *H01R 12/7076* (2013.01); *H01R 13/2464* (2013.01); *H05K 1/181* (2013.01); *H05K 2201/10325* (2013.01)

(58) Field of Classification Search
CPC ............ H05K 7/1069; H01R 12/77076; G01R 1/0466
See application file for complete search history.

(56) References Cited

U.S. PATENT DOCUMENTS

| 4,639,063 | A | * | 1/1987 | Mueller | H01R 12/79 |
| | | | | | 439/325 |
| 4,948,378 | A | * | 8/1990 | Hoshino | H01R 12/714 |
| | | | | | 439/271 |
| 5,356,308 | A | * | 10/1994 | Toba | H01R 13/5219 |
| | | | | | 439/495 |
| 5,396,402 | A | * | 3/1995 | Perugini | H01L 23/4093 |
| | | | | | 257/718 |
| 6,060,894 | A | * | 5/2000 | Hembree | G01R 31/2886 |
| | | | | | 324/756.07 |

(Continued)

FOREIGN PATENT DOCUMENTS

| JP | A1015076360 | 5/2015 |
| WO | 2015076360 A1 | 5/2015 |

*Primary Examiner* — Neil Abrams

(57) ABSTRACT

A socket connector assembly for a communication system includes a socket connector having a socket housing holding socket contacts having deflectable spring beams. The socket connector assembly includes a cable assembly coupled to the socket connector having an outer housing holding a paddle card with paddle card contacts interfacing with the separable mating interfaces of the socket contacts. The cable assembly includes cables terminated to the paddle card coupled to corresponding paddle card contacts. The socket connector assembly includes a spring plate coupled to the outer housing secured to the host circuit board to press the cable assembly downward toward the host circuit board to compress the deflectable spring beams of the socket contacts.

21 Claims, 6 Drawing Sheets

(56) References Cited

U.S. PATENT DOCUMENTS

| | | | | |
|---|---|---|---|---|
| 6,164,979 | A  * | 12/2000 | Gillette | H01R 12/79 |
| | | | | 439/67 |
| 7,046,020 | B2 * | 5/2006 | LaMeres | G01R 1/07314 |
| | | | | 324/754.07 |
| 7,291,022 | B2 | 11/2007 | Toda et al. | |
| 7,407,408 | B1 * | 8/2008 | Taylor | H05K 1/118 |
| | | | | 439/449 |
| 7,448,897 | B2 * | 11/2008 | Dawiedczyk | H01R 13/6275 |
| | | | | 439/357 |
| 7,654,829 | B1 * | 2/2010 | Chuang | H01R 12/79 |
| | | | | 439/67 |
| 7,833,042 | B2 * | 11/2010 | Nishio | G02B 6/4284 |
| | | | | 439/160 |
| 9,178,297 | B2 * | 11/2015 | Kodaira | H01R 12/771 |
| 9,281,597 | B2 * | 3/2016 | Hashiguchi | H01R 13/24 |
| 9,379,467 | B2 * | 6/2016 | Shimotsu | G02B 6/4284 |
| 9,494,750 | B2 * | 11/2016 | Lee | G02B 6/3821 |
| 9,912,084 | B2 * | 3/2018 | Costello | G06F 1/185 |
| 11,171,432 | B2 * | 11/2021 | Parkes | H01R 13/639 |
| 2009/0208168 | A1 * | 8/2009 | Ishikawa | H01R 12/79 |
| | | | | 439/620.22 |
| 2021/0345506 | A1 * | 11/2021 | Tsuji | G01R 1/0466 |

* cited by examiner

SOCKET CONNECTOR AND CABLE ASSEMBLY FOR A COMMUNICATION SYSTEM

BACKGROUND OF THE INVENTION

The subject matter herein relates generally to a communication system.

The ongoing trend toward smaller, lighter, and higher performance electrical components and higher density electrical circuits has led to the development of surface mount technology in the design of printed circuit boards and electronic packages. Surface mountable packaging allows for a separable connection of an electronic package, such as an integrated circuit or a computer processor, to pads on the surface of the circuit board rather than by contacts or pins soldered in plated holes going through the circuit board. Surface mount technology may allow for an increased component density on a host circuit board, thereby saving space on the host circuit board. Conventional architecture includes electrical paths defined through the host circuit board to electrical components mounted to the host circuit board remote from the electronic package. The electrical paths are defined by circuit traces routed between the electronic package and the electrical components. The routing of the circuits between the electronic package and the electrical components occupy board space on the host circuit board. Additionally, the electrical performance of the communication system is reduced by the long lengths of the circuit traces. Conventional systems are struggling with meeting signal output while maintaining good electrical performance through the system.

A need remains for a communication system having improved electrical performance.

BRIEF DESCRIPTION OF THE INVENTION

In one embodiment, a socket connector assembly for a communication system is provided. The socket connector assembly includes a socket connector configured to be mounted to a host circuit board. The socket connector includes a socket housing having a socket opening. A bottom of the socket housing is configured to be mounted to the host circuit board. The socket housing holding socket contacts each including a deflectable spring beam having a separable mating interface. The socket connector assembly includes a cable assembly coupled to the socket connector. The cable assembly includes an outer housing having a paddle card pocket open at a bottom of the outer housing. The cable assembly includes a paddle card received in the paddle card pocket. The paddle card extends between a mating end and a cable end. The paddle card has an upper paddle card surface and a lower paddle card surface. The paddle card includes paddle card contacts at the mating end on the lower paddle card surface interfacing with the separable mating interfaces of the upper socket contacts when the cable assembly is coupled to the socket connector. The cable assembly includes cables terminated to the paddle card at the cable end of the paddle card. The cables are communicatively coupled to corresponding paddle card contacts. The socket connector assembly includes a spring plate coupled to the outer housing. The spring plate is configured to be secured to the host circuit board to press the cable assembly downward toward the host circuit board to compress the deflectable spring beams of the upper socket contacts.

In another embodiment, a socket connector assembly for a communication system is provided. The socket connector assembly includes a socket connector configured to be mounted to a host circuit board. The socket connector includes a socket housing having a socket opening. A bottom of the socket housing is configured to be mounted to the host circuit board. The socket housing holding socket contacts each including a deflectable spring beam having a separable mating interface. The socket connector assembly includes a cable assembly coupled to the socket connector. The cable assembly includes an outer housing having a paddle card pocket open at a bottom of the outer housing. The cable assembly includes a paddle card received in the paddle card pocket. The paddle card extends between a mating end and a cable end. The paddle card has an upper paddle card surface and a lower paddle card surface. The paddle card includes paddle card contacts at the mating end on the lower paddle card surface interfacing with the separable mating interfaces of the upper socket contacts when the cable assembly is coupled to the socket connector. The cable assembly includes cables terminated to the paddle card at the cable end of the paddle card. The cables are communicatively coupled to corresponding paddle card contacts. The outer housing engages the pre-load latch to hold the cable assembly in a first position on the socket connector by a first holding force sufficient to pre-load the paddle card against the deflectable spring beams of the upper socket contacts and/or the cable tension (e.g., tension exerted by the cables). The socket connector assembly includes a spring plate coupled to the outer housing after the pre-load latch holds the cable assembly in the first position. The spring plate is configured to be secured to the host circuit board to press the cable assembly downward toward the host circuit board to a second position. The deflectable spring beams of the upper socket contacts are further compressed from the first position to the second position.

In a further embodiment, a socket connector assembly for a communication system is provided. The socket connector assembly includes a socket connector configured to be mounted to a host circuit board. The socket connector includes a socket housing having a socket opening. The socket housing includes a locating feature extending from a top of the socket housing. A bottom of the socket housing is configured to be mounted to the host circuit board. The socket housing holding socket contacts each including a deflectable spring beam having a separable mating interface. The socket connector assembly includes a cable assembly coupled to the socket connector. The cable assembly includes an outer housing having a paddle card pocket open at a bottom of the outer housing. The cable assembly includes a paddle card received in the paddle card pocket. The paddle card extends between a mating end and a cable end. The paddle card has an upper paddle card surface and a lower paddle card surface. The paddle card includes paddle card contacts at the mating end on the lower paddle card surface interfacing with the separable mating interfaces of the upper socket contacts when the cable assembly is coupled to the socket connector. The cable assembly includes cables terminated to the paddle card at the cable end of the paddle card. The cables are communicatively coupled to corresponding paddle card contacts. The cable assembly engages the locating feature to position the cable assembly relative to the socket connector. The socket connector assembly includes a spring plate coupled to the outer housing. The spring plate is configured to be secured to the host circuit board to press the cable assembly downward toward the host circuit board to compress the deflectable spring beams of the upper socket contacts.

DETAILED DESCRIPTION OF THE INVENTION

Figure 1:
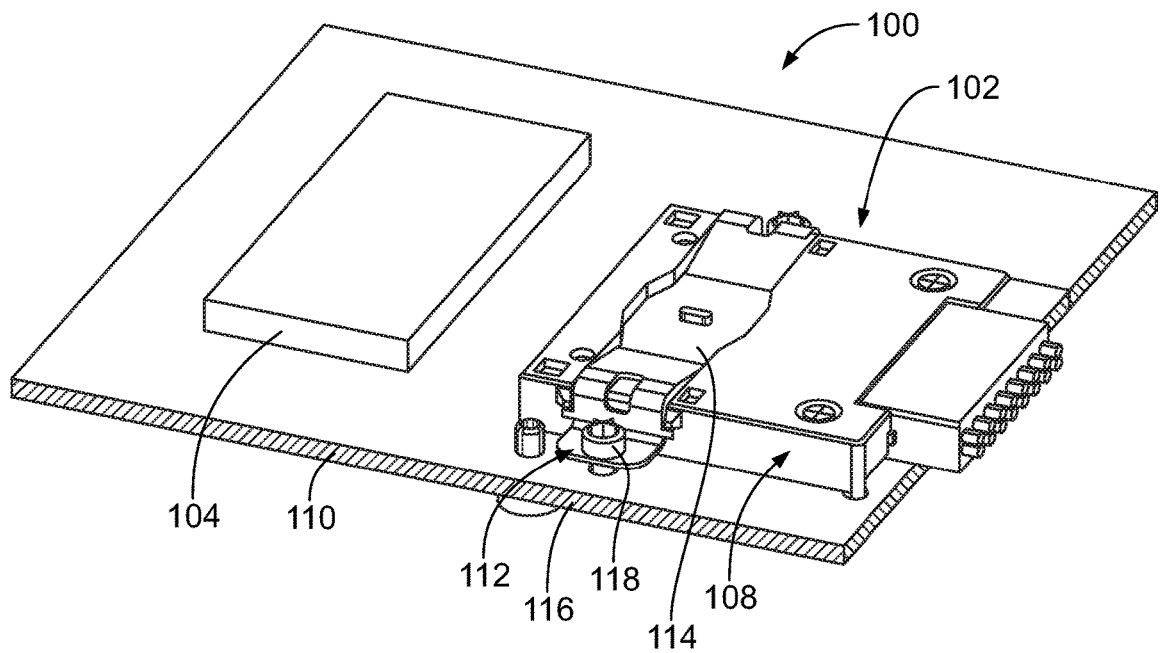
FIG. 1 illustrates a communication system formed in accordance with an exemplary embodiment.

FIG. 1 illustrates a communication system 100 formed in accordance with an exemplary embodiment. The communication system 100 includes one or more socket connector assemblies 102 electrically connected to an electronic package 104, such as an integrated circuit. Each socket connector assembly 102 includes a socket connector 106 (FIG. 2) and a cable assembly 108 coupled to the socket connector 106. The electronic package 104 and the socket connector(s) 106 are coupled to a host circuit board 110, such as a motherboard. The socket connector 106 is electrically connected to the electronic package 104 through the host circuit board 110. The socket connector 106 electrically connects the electronic package 104 with the cable assembly 108. In various embodiments, the electronic package 104 may be directly coupled to the host circuit board 110, such as soldering the electronic package 104 using a ball grid array of solder balls. In other various embodiments, the electronic package 104 may be coupled to the host circuit board 110 using a socket connector.

The electronic package 104 may transmit high speed data, low speed data and/or power through the interface between the electronic package 104 and the host circuit board 110. The socket connectors 106 may transmit high speed data, low speed data and/or power through the interface between the socket connector 106 and the host circuit board 110. In an exemplary embodiment, high speed data signals may be transmitted between the socket connector assemblies 102 and the electronic package 104. The socket connector 106 may be positioned in close proximity to the electronic package 104, such as immediately adjacent to the electronic package 104. As such, the circuit traces of the host circuit board 110 connecting the socket connector assembly 102 and the electronic package 104 are relatively short. The circuit traces have little signal degradation along the short circuit traces between the electronic package 104 and the socket connector assemblies 102.

The electronic package 104 may be any type of component, such as a data communication device. For example, the electronic package 104 may be an integrated circuit, such as an application-specific integrated circuit (ASIC), a chip, a microprocessor, and the like. In other various embodiments, the electronic package 104 may be an electrical connector, such as a high speed differential pair receptacle connector, a header connector, a card edge connector, and the like. The electrical connector may define an interface for interfacing with another mating connector, such as a cable connector, a paddle card connector, or another type of mating connector.

In an exemplary embodiment, the cable assembly 108 is mounted to the host circuit board 110 using mounting hardware 112. In the illustrated embodiment, the mounting hardware 112 includes a spring plate 114 that is secured to a backer plate 116 using threaded fasteners 118. The spring plate 114 is used to compress the cable assembly 108 against the socket connector 106, such as to compress deflectable spring beams of the socket connector 106 to create a reliable and separable mating interface.

In an exemplary embodiment, the socket connector assembly 102 has a low profile or height above the host circuit board 110. For example, the height may be similar to the height of the electronic package 104. The low profile allows connection of a heat sink or other component to the top of the electronic package, such as to dissipate heat from the chip of the electronic package 104. The cables of the cable assemblies 108 extend outward from one or more sides of the cable assembly within the low profile of the socket connector assemblies 102.

Figure 2:
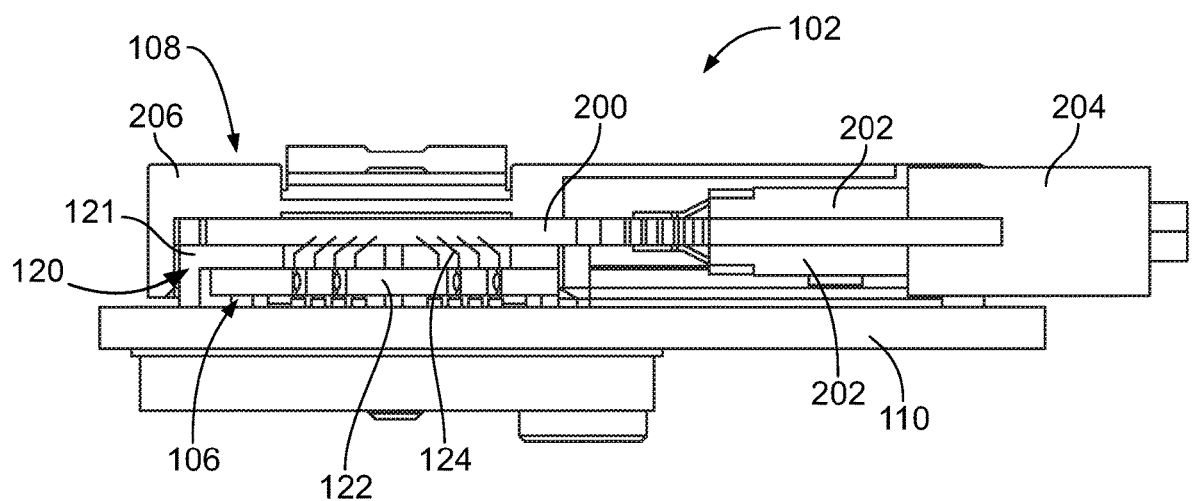
FIG. 2 is a cross-sectional view of a portion of the communication system showing the socket connector assembly in accordance with an exemplary embodiment.

FIG. 2 is a cross-sectional view of a portion of the communication system 100 showing the socket connector assembly 102 in accordance with an exemplary embodiment. FIG. 2 illustrates the socket connector 106 coupled to the host circuit board 110. FIG. 2 illustrates the cable assembly 108 coupled to the socket connector 106 at a separable interface. For example, the socket connector 106 includes an array of socket contacts having separable mating interfaces. The socket contacts may define a compressible interface, such as including deflectable spring beams that are compressed when the cable assembly 108 is coupled to the socket connector 106.

In an exemplary embodiment, the socket connector 106 includes a socket housing 120 holding socket contacts 124. In an exemplary embodiment, the socket housing 120 includes a socket frame 121 and a socket substrate 122 held in the socket frame 121. The socket substrate 122 may be a printed circuit board. The socket substrate 122 includes conductors, such as traces, vias, pads, and the like. The conductors may have solder balls, solder pads, or deflectable spring beams at the bottom of the socket substrate 122 for electrically connecting to the host circuit board 110. In the illustrated embodiment, the socket substrate 122 holds the socket contacts 124. For example, the socket contacts 124 may be soldered to corresponding conductors of the socket substrate 122. In other various embodiments, the socket contacts 124 may be sticked into the socket substrate 122, such as being pressed into channels in the socket substrate 122. The socket contacts 124 are configured to be electrically connected to the cable assembly 108. The socket contacts 124 may be arranged in an array defining a land grid array (LGA) interface. For example, the socket contacts 124 may include spring beams defining a compressible interface, which are compressed when the cable assembly 108 is coupled to the socket connector 106. While the embodiments of the socket housing 120 illustrated herein include the socket frame 121 and the socket substrate 122, the socket housing 120 may be a single piece housing in alternative embodiments. For example, components of the socket frame 121 and/or the socket substrate 122 may be included as components of the socket housing 120. In various embodiments, the socket housing 120 may be a molded piece having contact channels receiving and holding the socket contacts 124.

The socket frame 121 holds and supports the socket substrate 122. The socket frame 121 may have locating features for locating the socket substrate 122 relative to the socket frame 121. The socket frame 121 includes frame walls 128 that surround a socket opening 130 that receives the socket substrate 122. The frame walls 128 may orient and align the socket substrate 122 in one or more directions. The socket frame 121 may include locating features for locating the cable assembly 108 relative to the socket connector 106. In an exemplary embodiment, the socket frame 121 may limit or stop compression of the compressible interface to prevent damage to various components.

The cable assembly 108 is coupled to the top of the socket connector 106 to create an electrical connection between the socket connector 106 and the cable assembly 108. In an exemplary embodiment, the cable assembly 108 includes a paddle card 200, cables 202 extending from the paddle card 200, an inner housing 204 holding the paddle card 200 and/or the cables 202, and an outer housing 206. The spring plate 114 is coupled to the outer housing 206 to mount the cable assembly 108 to the host circuit board 110. The cables 202 are terminated to the paddle card 200. The paddle card 200 is held in the outer housing 206. The paddle card 200 is coupled to the socket connector 106 when the cable assembly 108 is coupled to the host circuit board 110.

Figure 3:
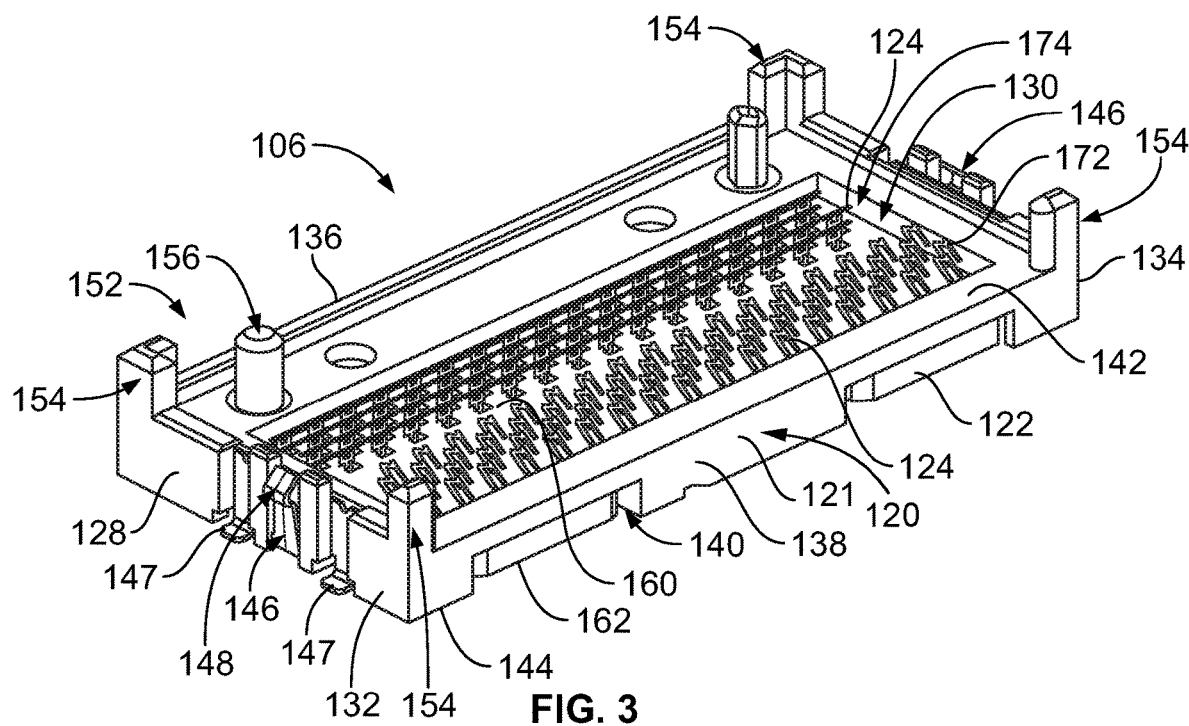
FIG. 3 is a top perspective view of the socket connector in accordance with an exemplary embodiment.
Figure 4:
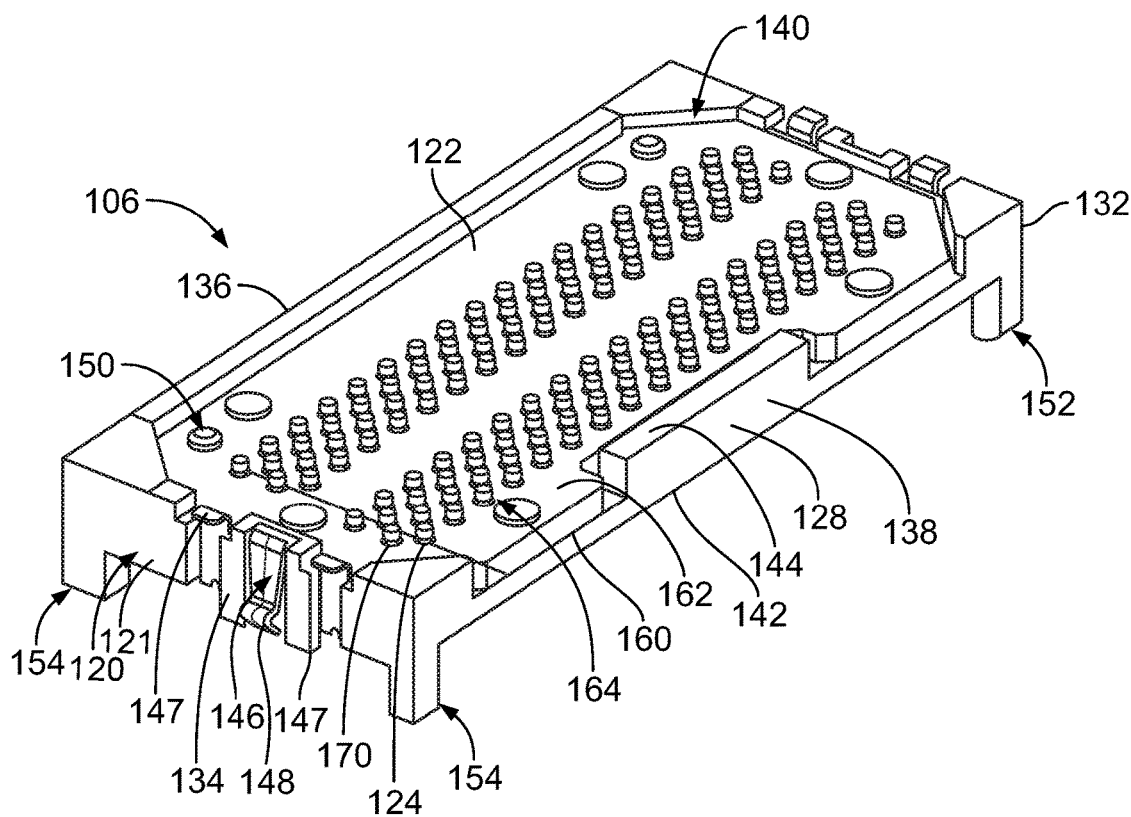
FIG. 4 is a bottom perspective view of the socket connector in accordance with an exemplary embodiment.

FIG. 3 is a top perspective view of the socket connector 106 in accordance with an exemplary embodiment. FIG. 4 is a bottom perspective view of the socket connector 106 in accordance with an exemplary embodiment. The socket connector 106 includes the socket frame 121 and the socket substrate 122 held in the socket frame 121. The socket frame 121 holds and supports the socket substrate 122 in the socket opening 130.

The socket frame 121 includes a first side wall 132, a second side wall 134 opposite the first side wall 132, a first end wall 136 and a second end wall 138 opposite the first end wall 136. The socket frame 121 extends between a top 142 and a bottom 144. The bottom 144 of the socket frame 121 is configured to be mounted to the host circuit board 110. In various embodiments, the socket frame 121 is generally rectangular in shape. However, the socket frame 121 may have other shapes in alternative embodiments. The side walls 132, 134 and the end walls 136, 138 form a pocket 140 configured to receive the socket substrate 122. The pocket 140 is provided at a bottom 144 of the socket frame 121, such as to receive the socket substrate 122 through the bottom 144. The socket substrate 122 is aligned with the socket opening 130 for mating with the cable assembly 108 (shown in FIG. 2).

In an exemplary embodiment, the socket connector 106 includes pre-load latches 146 coupled to the side walls 132, 134. Each pre-load latch 146 includes mounting features 147, such as solder tabs, configured to be coupled to the host circuit board 110. For example, the mounting features 147 may be soldered to the host circuit board 110 to mechanically secure the socket frame 121 to the host circuit board 110. The mounting features 147 increase solder peeling strength of the socket connector 106 to prevent damage to the solder interface of the socket contacts 1245 with the host circuit board 110. The pre-load latch 146 includes a latch beam 148 configured to latchably secure to the cable assembly 108. The latch beam 148 is deflectable to allow the cable assembly 108 to mate to and unmate from the socket connector 106. The pre-load latches 146 are used to temporarily couple the cable assembly 108 to the socket connector 106 (for example, until the spring plate 114 can secure the cable assembly 108 to the socket connector 106). The pre-load latches 146 prevent floating of the cable assembly 108 relative to the socket connector 106 for attachment of the spring plate 114 to the host circuit board 110. The pre-load latches 146 are used to pre-load the socket contacts 124 (for example, partially deflect the socket contacts 124) and/or to prevent the cable tension from lifting the cable assembly, until the spring plate 114 can be installed and more fully compress the socket contacts 124.

In an exemplary embodiment, the socket frame 121 includes locating features 150 for locating the socket substrate 122 relative to the socket frame 121. For example, the locating features 150 may extend into the pocket 140 to engage and locate the socket substrate 122 in the pocket 140. The locating features 150 may orient and align the socket substrate 122 in one or more directions. The locating features 150 may include walls or surfaces configured to engage outer edges of the socket substrate 122. The locating features 150 may include posts or pins received in openings in the socket substrate 122. The socket substrate 122 may be secured to the socket frame 121, such as being heat staked, adhered or otherwise secured to the socket frame 121.

In an exemplary embodiment, the socket frame 121 includes locating features 152 for locating the cable assembly 108 relative to the socket connector 106. For example, the locating features 152 may extend from the top 142 of the socket frame 121. In an exemplary embodiment, the locating features 152 include outer housing posts 154 configured to engage and locate the outer housing 206 (FIG. 2) relative to the socket frame 121. In an exemplary embodiment, the locating features 152 include paddle card posts 156 configured to engage and locate the paddle card 200 (FIG. 2) relative to the socket frame 121. The paddle card posts 156 extend from the top 142 of the socket frame 121. The paddle card posts 156 may be located proximate to the first end wall 136; however, the paddle card posts 156 may be at other locations in alternative embodiments. The paddle card posts 156 may be cylindrical posts, square posts or may have other shapes.

The outer housing posts 154 have chamfered distal ends to guide mating of the cable assembly 108 with the socket connector 106. The outer housing posts 154 may be located at the first side wall 132 and/or the second side wall 134. The outer housing posts 154 may be located at the first end wall 136 and/or the second end wall 138. In the illustrated embodiment, the socket frame 121 includes four outer housing posts 154 at the four corners of the socket frame 121. By placing the outer housing posts 154 in the corners of the socket frame 121, each outer housing post 154 is able to locate the outer housing 206 in two different directions (for example, front-to-rear and side-to-side).

The socket substrate 122 extends between an upper socket substrate surface 160 and a lower socket substrate surface 162. The socket contacts 124 are coupled to the socket substrate 122 and may extend from the upper socket substrate surface 160 and/or the lower socket substrate surface 162. In an exemplary embodiment, the socket contacts 124 are stitched contacts loaded into channels or openings in the socket substrate 122. Alternatively, the socket contacts 124 may be surface mount contacts surface mounted (for example, soldered) to traces or pads of the socket substrate 122. In an exemplary embodiment, the socket contacts 124 provide a separable, compressible mating interface at the top of the socket substrate 122. In an exemplary embodiment, the socket substrate 122 includes lower socket conductors 164 at the lower socket substrate surface 162. In the illustrated embodiment, the lower socket conductors 164 include solder balls soldered to bottom ends of the socket contacts 124 or soldered to traces or pads of the socket substrate 122 at the lower socket substrate surface 162. Other types of conductors may be provided at the bottom in alternative embodiments. For example, in various embodiments, the socket contacts 124 may be provided at the lower socket substrate surface 162 to provide a separable, compressible mating interface at the bottom of the socket substrate 122.

The socket contacts 124 are arranged in rows and columns as an array. The socket contacts 124 are arranged in the socket opening 130 for mating with the cable assembly 108. Each socket contact 124 includes a base 170 and a deflectable spring beam 172 extending from the base 170. The base 170 is coupled to the socket substrate 122, such as being received in a channel or opening in the socket substrate 122 or being soldered to the socket substrate 122. The spring beam 172 extends to a separable mating interface 174 opposite the base 170. The spring beam 172 may be curved at the mating interface 174. In various embodiments, the socket contact 124 may include a tail at the bottom of the socket contacts 124 receiving the lower socket conductors 164 (for example, the solder ball).

Figure 5:
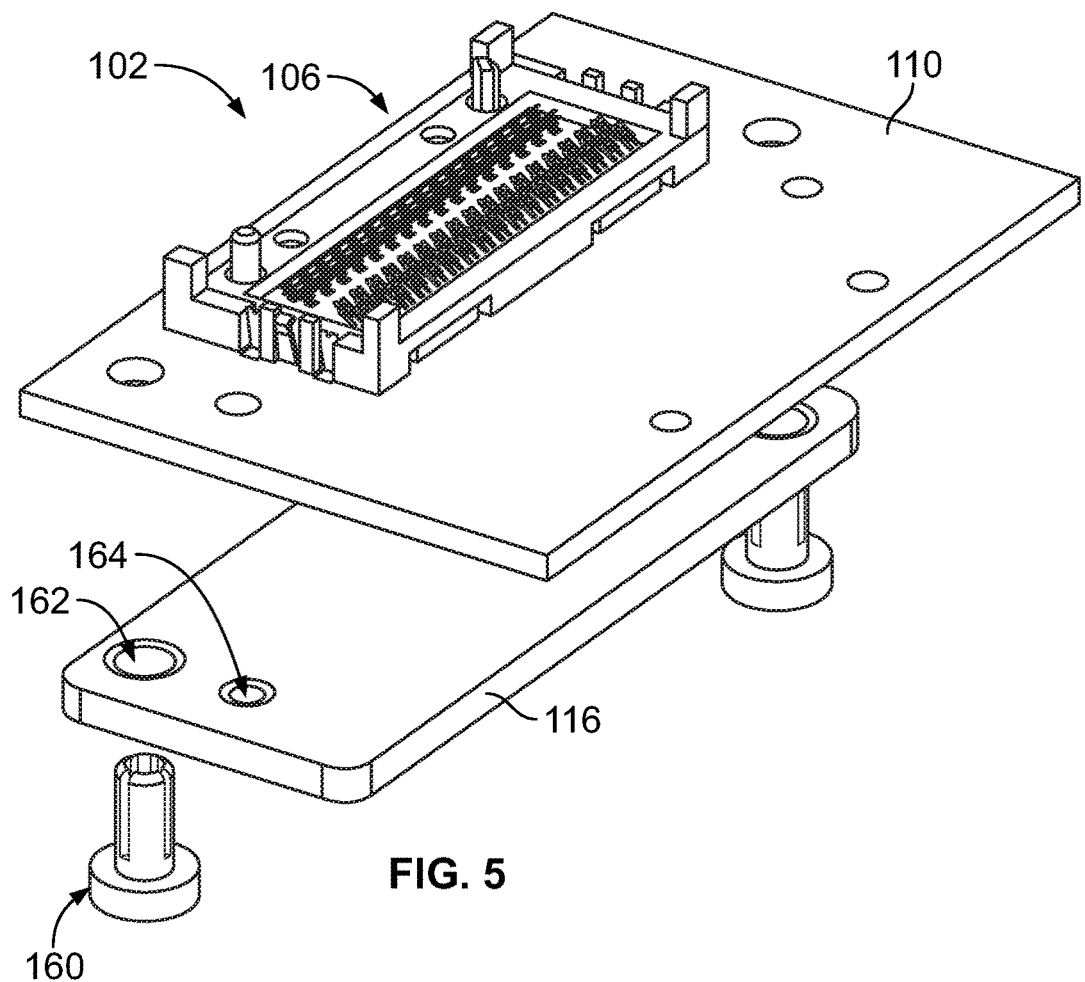
FIG. 5 is an exploded view of a portion of the socket connector assembly showing the socket connector mounted to the host circuit board in accordance with an exemplary embodiment.
Figure 6:
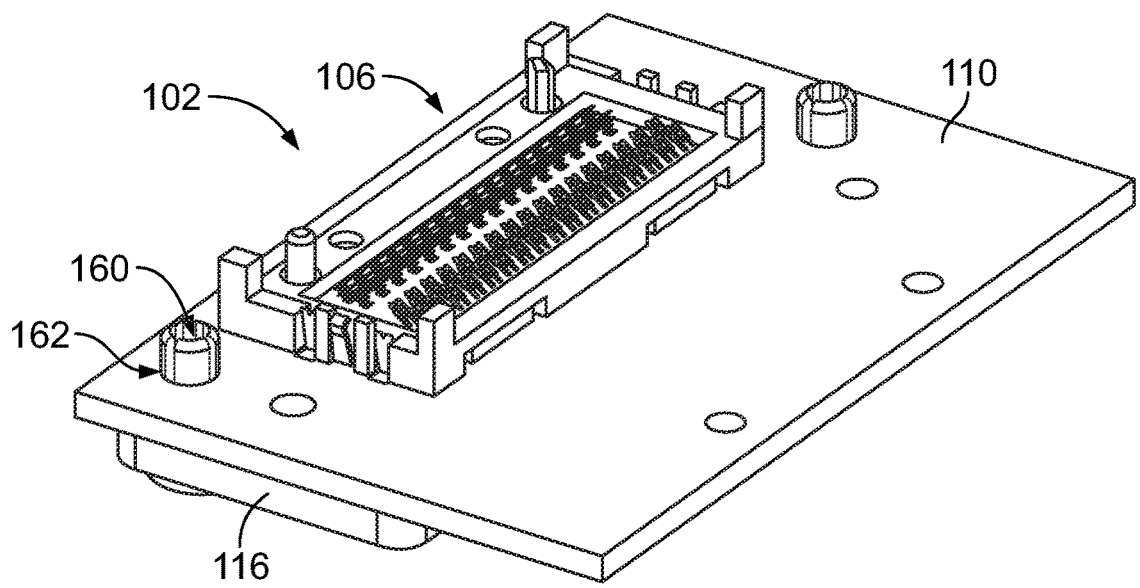
FIG. 6 is a top perspective view of a portion of the socket connector assembly showing the socket connector mounted to the host circuit board in accordance with an exemplary embodiment.

FIG. 5 is an exploded view of a portion of the socket connector assembly 102 showing the socket connector 106 mounted to the host circuit board 110. FIG. 6 is a top perspective view of a portion of the socket connector assembly 102 showing the socket connector 106 mounted to the host circuit board 110. FIGS. 5 and 6 illustrate the backer plate 116. The backer plate 116 provides a rigid mounting structure to secure the spring plate 114 to the host circuit board 110. The backer plate 116 may be used to prevent warpage of the host circuit board 110 at the mounting area.

The backer plate 116 is mounted to the bottom of the host circuit board 110 using mounting hardware 180. For example, the mounting hardware 180 includes push rivets received in openings 182 that are used to secure the backer plate 116 to the host circuit board 110. The push rivets hold the backer plate 116 in position on the host circuit board 110 to receive the mounting hardware 112 (FIG. 1) in openings 184 to secure the spring plate 114 (FIG. 1) to the host circuit board 110. The push rivets withstand pressing load applied to secure the spring plate 114 to the backer plate 116. The openings 184 may be threaded openings configured to receive the threaded fasteners of the mounting hardware 112. Other types of mounting hardware 180 may be used in alternative embodiments, such as threaded fasteners. In various embodiments, the mounting hardware 180 may have a threaded bore configured to receive the mounting hardware 112, rather than having the mounting hardware 112 connected to the backer plate 116 separate from the mounting hardware 180.

Figure 7:
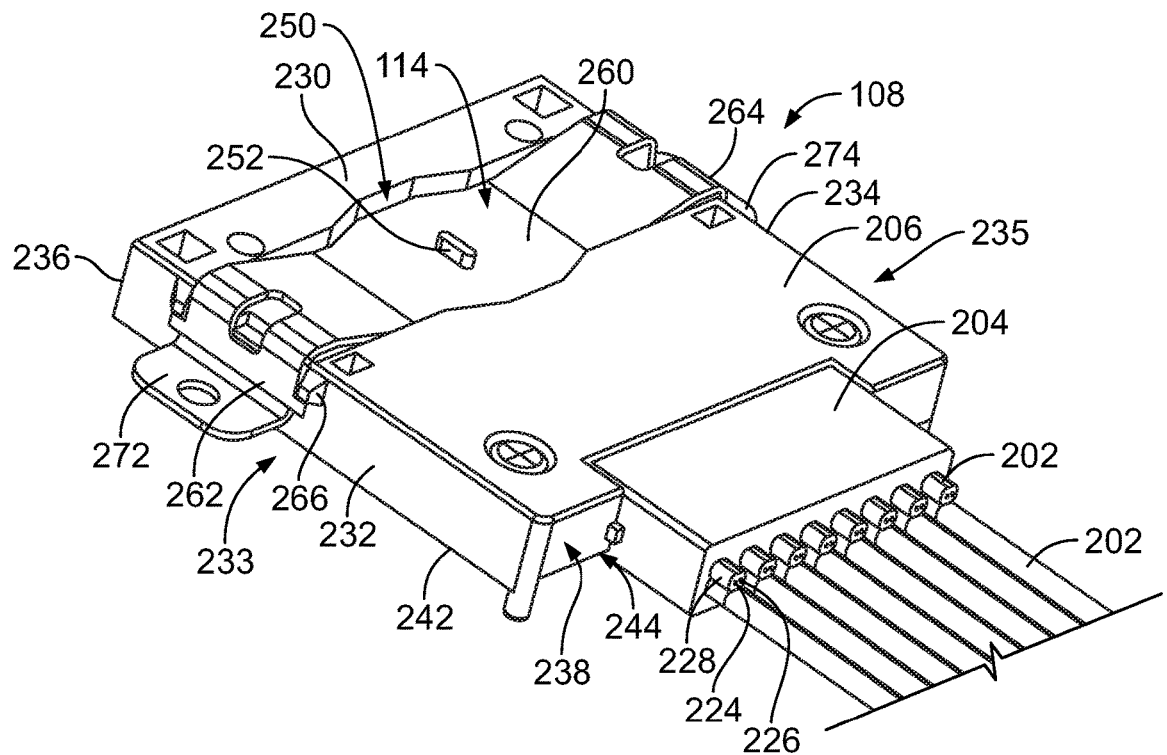
FIG. 7 is a top perspective view of the cable assembly in accordance with an exemplary embodiment.
Figure 8:
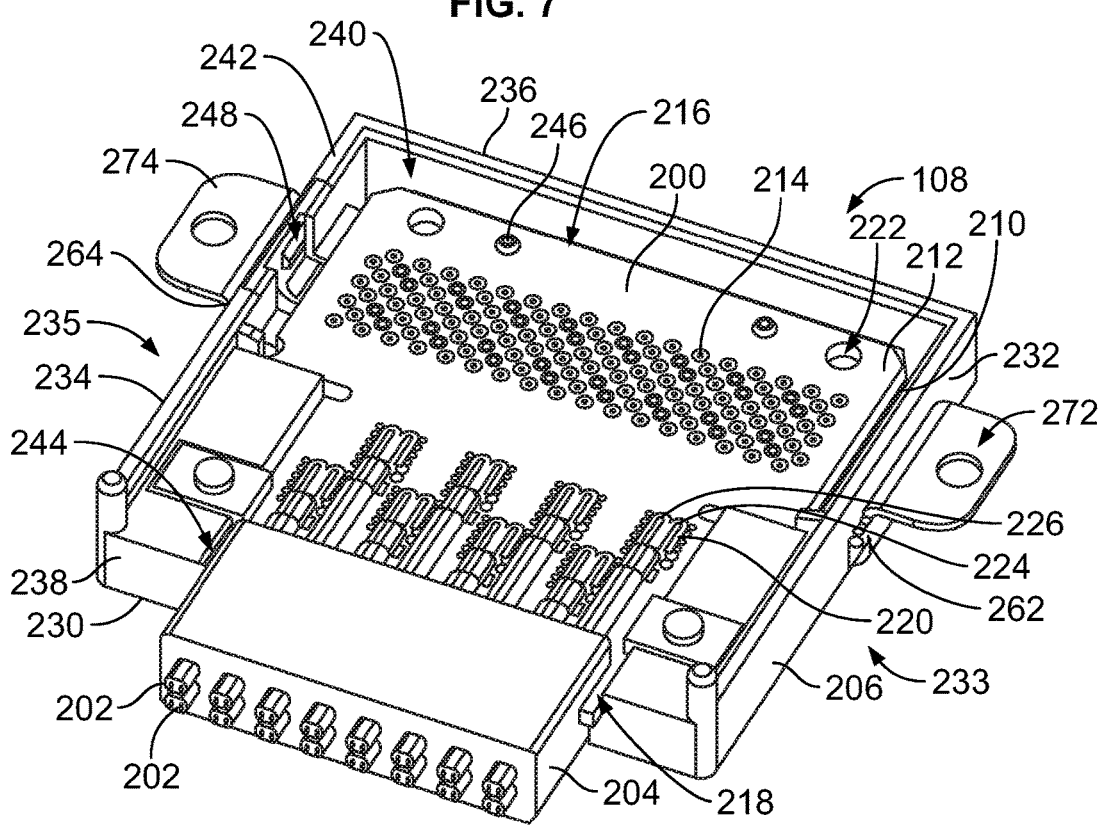
FIG. 8 is a bottom perspective view of the cable assembly in accordance with an exemplary embodiment.

FIG. 7 is a top perspective view of the cable assembly 108 in accordance with an exemplary embodiment. FIG. 8 is a bottom perspective view of the cable assembly 108 in accordance with an exemplary embodiment. The cable assembly 108 includes the outer housing 206, the inner housing 204 held by the outer housing 206 and the paddle card 200 held by the outer housing 206. The inner housing 204 is coupled to the cables 202 and may be coupled to the paddle card 200. The spring plate 114 is coupled to the outer housing 206, such as to an exterior of the outer housing 206.

The paddle card 200 extends between an upper paddle card surface 210 and a lower paddle card surface 212. The paddle card 200 includes paddle card contacts 214 at the lower paddle card surface 212. The paddle card 200 extends between a mating end 216 and a cable end 218. The cable end 218 may be opposite the mating end 216 in various embodiments. The paddle card contacts 214 are provided at the mating end 216 for mating with the socket connector 106 (shown in FIG. 4). In an exemplary embodiment, the paddle card contacts 214 are arranged in rows and columns as an array. The array of paddle card contacts 214 corresponds with the array of socket contacts 124 (shown in FIG. 5) for interfacing with the socket contacts 124.

The cables 202 are coupled to the paddle card 200 proximate to the cable end 218. For example, cable termination pads 220 may be provided at the upper paddle card surface 210 and/or the lower paddle card surface 212 at the cable end 218. In an exemplary embodiment, the cable termination pads 220 are circuit traces. Other types of contacts may be provided in alternative embodiments to electrically connect the cables 202 to the paddle card 200. In other various embodiments, the cables 202 may be fiber optic cables connected to the paddle card 200 at an optical connector. In an exemplary embodiment, the cable termination pads 220 are arranged in an array such as in one or more rows. Staggering of the cable termination pads 220 allows a denser array of cable termination pads 220.

In an exemplary embodiment, the paddle card 200 includes locating openings 222 configured to receive paddle card posts 156 (FIG. 3) to locate the paddle card 200 relative to the socket connector 106. The locating openings 222 may be circular. However, the locating openings 222 may have other shapes in alternative embodiments, such as being oval. The locating openings 222 may be positioned proximate to the mating end 216; however, other positions are possible in alternative embodiments.

In an exemplary embodiment, the cables 202 may be twin-axial cables having first and second conductors 224, 226 arranged as pairs and may include a cable shield (not shown) providing electrical shielding for the pairs of conductors 224, 226. The cable shield may be electrically connected to the paddle card 200, for example, via ground termination pads on the paddle card 200. The cable 202 includes a cable jacket 228 surrounding the cable shield and the conductors 224, 226. Other types of cables may be provided in alternative embodiments.

The inner housing 204 is coupled to the paddle card 200, such as to the upper paddle card surface 210 and the lower paddle card surface 212. The inner housing 204 may be coupled to the cables 202, such as to provide strain relief for the cables 202. In various embodiments, the inner housing 204 may be molded in place on the paddle card 200 and the cables 202. For example, the inner housing 204 may be an overmolded body. The inner housing 204 may be manufactured from a dielectric material, such as a plastic material.

The outer housing 206 receives the inner housing 204, the paddle card 200 and portions of the cables 202. In the illustrated embodiment, the cables 202 extend rearward from the outer housing 206. However, the cables 202 may extend in other direction in alternative embodiments, such as from a first side or a second side from the outer housing 206. In an exemplary embodiment, the outer housing 206 includes an upper wall 230, a first side wall 232 at a first side 233, a second side wall 234 at a second side 235, a first end wall 236 between the side walls 232, 234, and a second end wall 238 between the side walls 232, 234. The walls form a paddle card pocket 240. In an exemplary embodiment, the paddle card pocket 240 is open at a bottom 242 of the outer housing 206. The paddle card pocket 240 receives the paddle card 200. In an exemplary embodiment, the second end wall 238 includes an opening 244 that receives the inner housing 204. The cables 202 exit through the opening 244. In alternative embodiments, the opening 244 may be provided at the first side wall 232 or the second side wall 234 for side exit of the cables 202.

In an exemplary embodiment, the outer housing 206 includes locating features 246 that engage the paddle card 200 and locate the paddle card 200 within the paddle card pocket 240. In the illustrated embodiment, the locating features 246 are posts or pins extending from the upper wall 230 into the paddle card pocket 240. Optionally, the openings in the paddle card 200 may be oversized relative to the posts to allow the paddle card 200 to move within the paddle card pocket 240, such as for positioning the paddle card 200 for mating with the socket connector 106. The locating features 246 may include walls or surfaces that engage edges of the paddle card 200 to locate the paddle card 200 within the paddle card pocket 240. The paddle card 200 may be held in the paddle card pocket 240 by an interference fit in various embodiments.

The outer housing 206 includes latching features 248 extending into the paddle card pocket 240. The latching features 248 are configured to interface with the pre-load latch 146 (FIG. 3) of the socket connector 106 to secure the cable assembly 108 to the socket connector 106. The latching features 248 are provided on the first and second side walls 232, 234 in the illustrated embodiment. Other locations are possible in alternative embodiments. Each latching feature 248 may be a catch having a latching surface configured to receive the pre-load latch 146. Other types of latching features 248 may be used in alternative embodiments. For example, the latching features 248 may be deflectable latches.

The outer housing 206 includes a spring plate pocket 250 at the upper wall 230 that receives the spring plate 114. The spring plate pocket 250 allows the spring plate 114 to be recessed in the upper wall 230 to maintain the low profile of the cable assembly 108. In an exemplary embodiment, the outer housing 206 includes a retainer 252 extending into the spring plate pocket 250 to retain the spring plate 114 in the spring plate pocket 250.

The spring plate 114 includes a base 260, a first spring arm 262 extending from the base 260 to a first side and a second spring arm 264 extending from the base 260 to a second side. The base 260 is received in the spring plate pocket 250 and coupled to the upper wall 230 by the retainer 252. In various embodiments, the base 260 may be planar and extend along the top of the outer housing 206. The spring arms 264, 266 may be flexed upward relative to the base 260. The spring arms 264, 266 may be movable relative to the base 260, such as for mounting to the host circuit board 110. In the illustrated embodiment, the spring arm 264 is M-shaped. However, the spring arm 264 may have other shapes in alternative embodiments. The first spring arm 262 extends to the first side wall 232 and is positioned at the first side wall 232 by positioning tabs 266. The second spring arm 264 extends to the second side wall 234 and is positioned at the second side wall 234 by positioning tabs (not shown). The spring arms 262, 264 include mounting tabs 272, 274, respectively, configured to be mounted to the host circuit board 110. For example, the mounting hardware 112 (FIG. 1) extends through openings in the mounting tabs 272, 274 for coupling to the backer plate 116.

Figure 9:
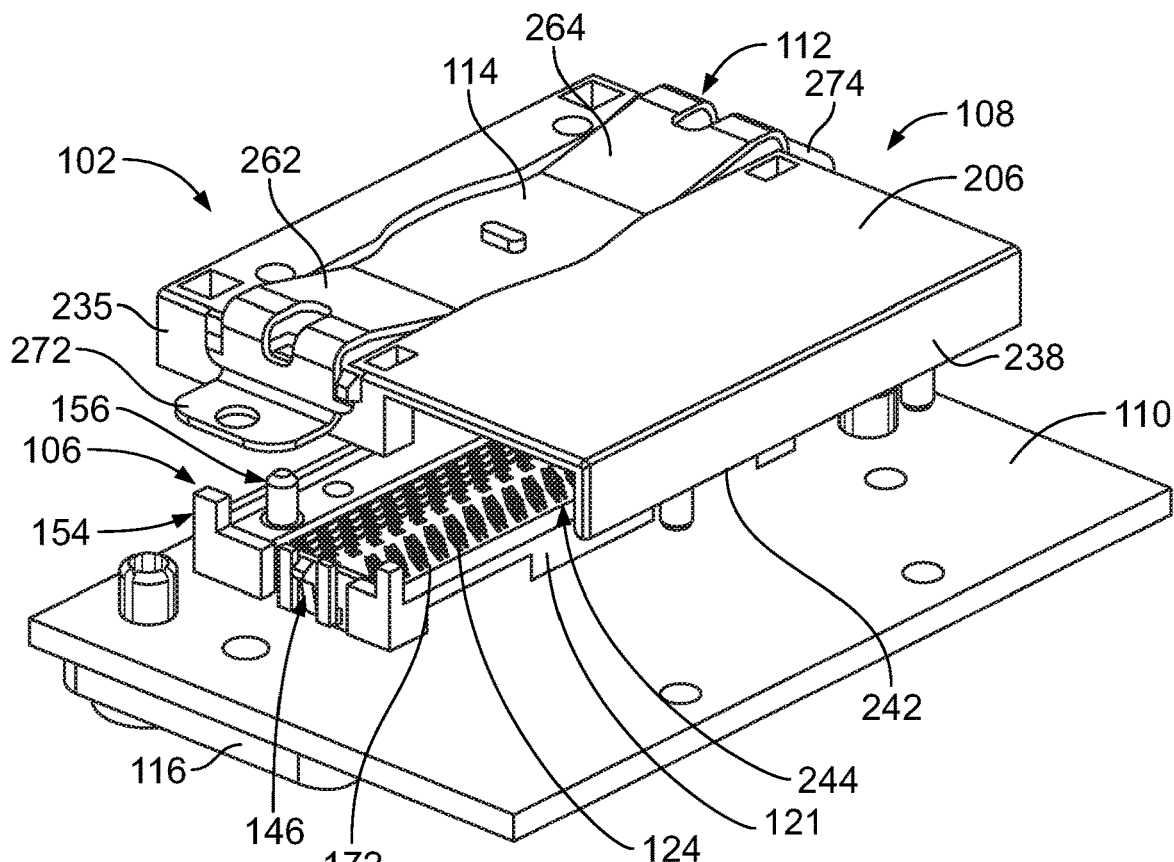
FIG. 9 is a top perspective view of a portion of the socket connector assembly in accordance with an exemplary embodiment showing the cable assembly poised for coupling to the socket connector.
Figure 10:
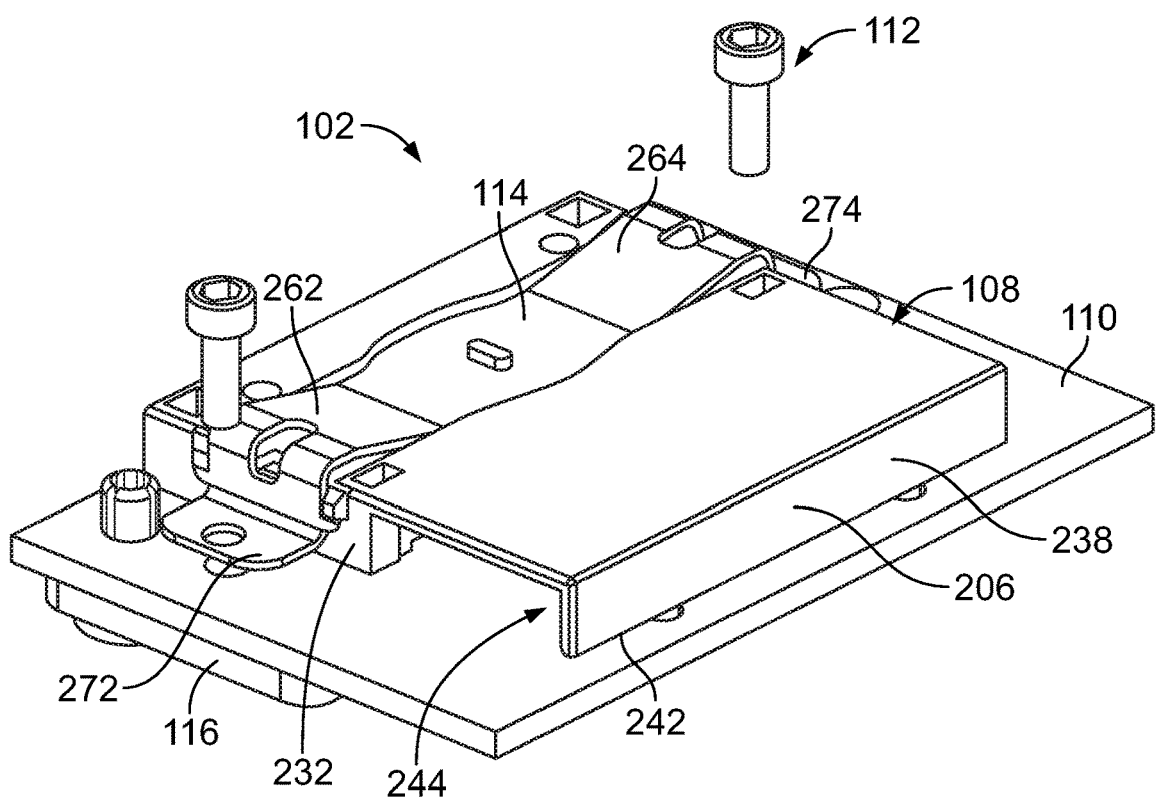
FIG. 10 is a top perspective view of the socket connector assembly in accordance with an exemplary embodiment showing the cable assembly coupled to the socket connector.
Figure 11:
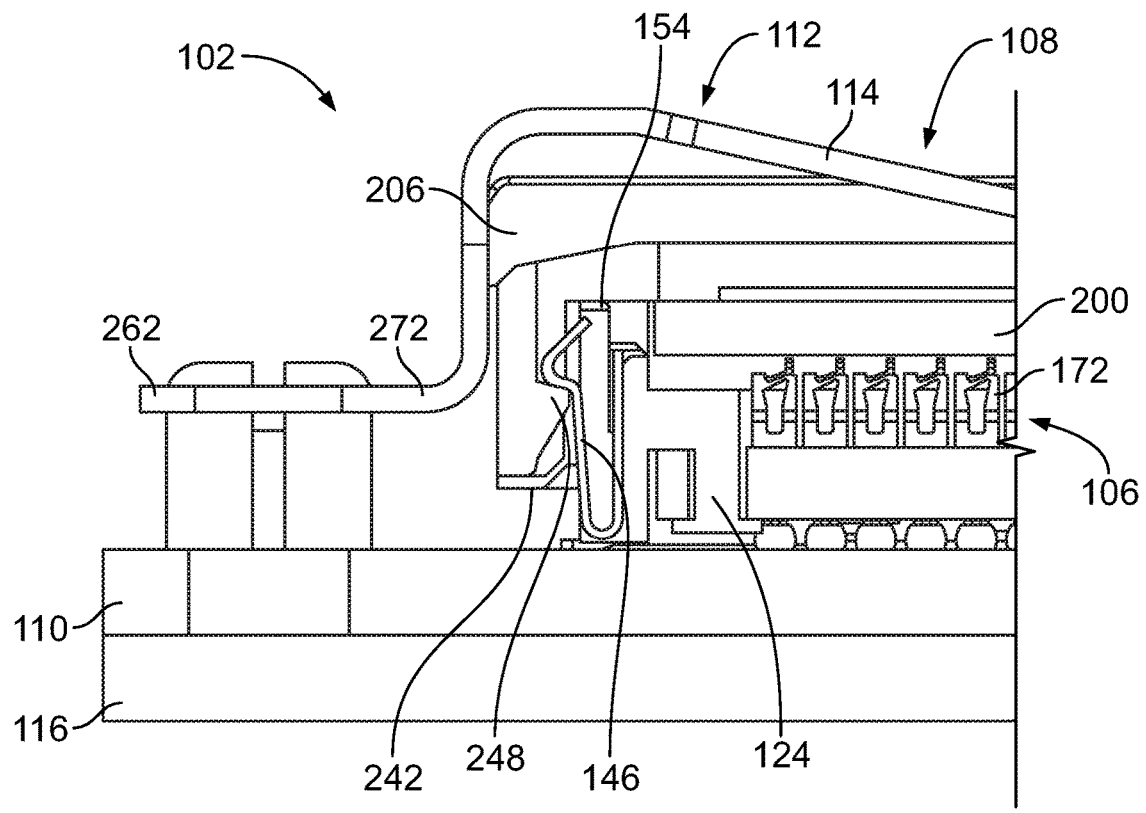
FIG. 11 is a cross-sectional view of a portion of the socket connector assembly in accordance with an exemplary embodiment showing the cable assembly at a first position.
Figure 12:
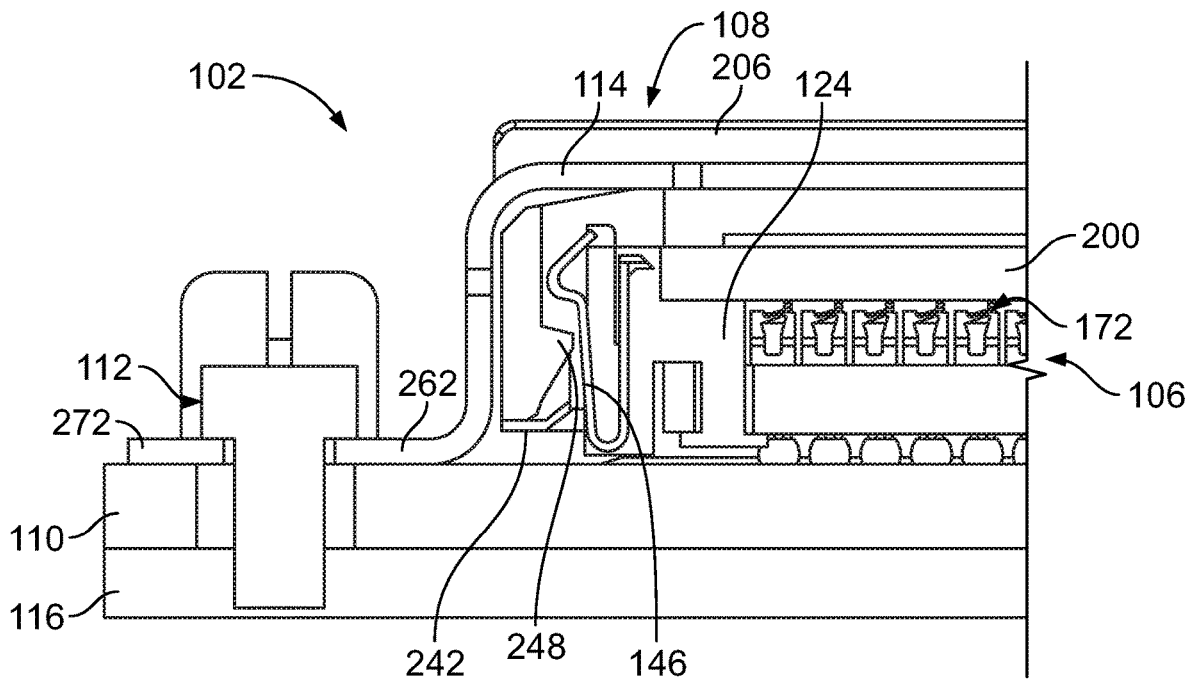
FIG. 12 is a cross-sectional view of a portion of the socket connector assembly in accordance with an exemplary embodiment showing the cable assembly at a second position.

FIG. 9 is a top perspective view of a portion of the socket connector assembly 102 in accordance with an exemplary embodiment showing the cable assembly 108 poised for coupling to the socket connector 106. FIG. 10 is a top perspective view of the socket connector assembly 102 in accordance with an exemplary embodiment showing the cable assembly 108 coupled to the socket connector 106. FIG. 11 is a cross-sectional view of a portion of the socket connector assembly 102 in accordance with an exemplary embodiment showing the cable assembly 108 at a first position. FIG. 12 is a cross-sectional view of a portion of the socket connector assembly 102 in accordance with an exemplary embodiment showing the cable assembly 108 at a second position. In the illustrated embodiment, the opening 244 for the cables 202 (not shown) is provided in the first side wall 232 rather than the second end wall 238. Other locations are possible in alternative embodiments.

During assembly, the cable assembly 108 is aligned with the socket connector 106 (for example, above the socket connector 106). The cable assembly 108 is mated with the socket connector 106 by pressing the cable assembly 108 downward onto the socket connector 106. The outer housing posts 154 initially engage the outer housing 206 to locate the outer housing 206 relative to the socket frame 121. The paddle card posts 156 are configured to engage the paddle card 200 to locate the paddle card 200 relative to the socket connector 106 (for example, relative to the mating interfaces of the socket contacts 124. The cable assembly 108 is coupled to the socket connector 106 to engage the outer housing 206 with the pre-load latches 146.

During assembly, the pre-load latches 146 engage the outer housing 206 and temporarily hold the outer housing 206 on the socket connector 106. The pre-load latches 146 are configured to engage the latching features 248 (FIG. 11) to hold the outer housing 206 in place on the socket frame 121. The pre-load latches 146 hold the cable assembly 108 in a first position on the socket connector 106. The cable assembly 108 is configured to move toward the host circuit board 110 from the first position, such as to compress the spring beams 182 of the socket contacts 124. The pre-load latches 146 hold the cable assembly 108 with a first holding force sufficient to pre-load the paddle card 200 against the deflectable spring beams 182 and/or the cable tension from lifting the cable assembly. The spring beams 182 may be partially compressed to pre-load the spring beams 182.

Once the cable assembly 108 is initially secured to the socket connector 106 using the pre-load latches 146 (FIG. 11), the spring plate 114 may be utilized to further couple the cable assembly 108 to the host circuit board 110. The spring arms 262, 264 of the spring plate 114 are coupled to the host circuit board 110. For example, the mounting hardware 112 is coupled to the backer plate 116. The mounting hardware 112 passes through the openings in the mounting tabs 272, 274 and passes through openings in the host circuit board for coupling to the backer plate 116. The mounting hardware may be threadably coupled to the backer plate 116. The spring plate 114 presses the cable assembly 108 downward toward the host circuit board 110 to a second position (FIG. 12), such as a seated position in which the bottom 242 of the outer housing 206 is seated on the host circuit board 110. The deflectable spring beams 182 of the socket contacts 124 are further compressed in the second position compared to the first position.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A socket connector assembly for a communication system comprising:
   a socket connector configured to be mounted to a host circuit board, the socket connector including a socket housing having a socket opening, a bottom of the socket housing configured to be mounted to the host circuit board, the socket housing holding socket contacts, each socket contact including a deflectable spring beam having a separable mating interface;
   a cable assembly coupled to the socket connector, the cable assembly including an outer housing having a paddle card pocket open at a bottom of the outer housing, the cable assembly including a paddle card received in the paddle card pocket, the paddle card extending between a mating end and a cable end, the paddle card having an upper paddle card surface and a lower paddle card surface, the paddle card including paddle card contacts at the mating end on the lower paddle card surface interfacing with the separable mating interfaces of the socket contacts when the cable assembly is coupled to the socket connector, the cable assembly including cables terminated to the paddle card at the cable end of the paddle card, the cables being communicatively coupled to corresponding paddle card contacts; and
   a spring plate coupled to the outer housing, the spring plate configured to be secured to the host circuit board using at least one fastener to press the cable assembly downward toward the host circuit board to compress the deflectable spring beams of the socket contacts.

2. The socket connector assembly of claim 1, wherein the spring plate is aligned with the paddle card.

3. The socket connector assembly of claim 1, wherein the spring plate includes a base, a first spring arm extending from the base to a first side of the outer housing, and a second spring arm extending from the base to a second side of the outer housing, the base being secured to a top of the outer housing, the first arm being secured to the host circuit board at the first side of the outer housing, the second arm being secured to the host circuit board at the second side of the outer housing, wherein the first and second spring arms spring bias the base downward to press the base against the top of the outer housing.

4. The socket connector assembly of claim 1, wherein the spring plate is secured to a backer plate below the host circuit board using the at least one fastener.

5. The socket connector assembly of claim 1, wherein the socket connector includes a pre-load latch extending into the socket opening, the outer housing engaging the pre-load latch to hold the cable assembly in a first position on the socket connector to pre-load the paddle card by a first holding force, the spring plate being coupled to the host circuit board after the pre-load latch holds the cable assembly in the first position, the spring plate pressing the cable assembly downward toward the host circuit board to a second position, the deflectable spring beams of the socket contacts being compressed as the paddle card moves from the first position to the second position.

6. The socket connector assembly of claim 5, wherein the pre-load latch is coupled to the socket housing, the pre-load latch being secured to the host circuit board independent of the socket housing and the lower socket contacts.

7. The socket connector assembly of claim 1, wherein the socket housing includes a locating feature extending from a top of the socket housing, the locating feature engaging the cable assembly to position the cable assembly relative to the socket connector.

8. The socket connector assembly of claim 7, wherein the locating feature includes outer housing posts extending from the top of the socket housing engaging the outer housing to locate the outer housing relative to the socket housing.

9. The socket connector assembly of claim 7, wherein the locating feature includes a paddle card post extending from a top of the socket housing being received in an opening in the paddle card to locate the paddle card relative to the socket housing.

10. A socket connector assembly for a communication system comprising:
    a socket connector configured to be mounted to a host circuit board, the socket connector including a socket housing having a socket opening, a bottom of the socket housing configured to be mounted to the host circuit board, the socket connector including a pre-load latch extending into the socket opening, the socket housing holding socket contacts, each socket contact including a deflectable spring beam having a separable mating interface;
    a cable assembly coupled to the socket connector, the cable assembly including an outer housing having a paddle card pocket open at a bottom of the outer housing, the cable assembly including a paddle card received in the paddle card pocket, the paddle card extending between a mating end and a cable end, the paddle card having an upper paddle card surface and a lower paddle card surface, the paddle card including paddle card contacts at the mating end on the lower paddle card surface interfacing with the separable mating interfaces of the socket contacts when the cable assembly is coupled to the socket connector, the cable assembly including cables terminated to the paddle card at the cable end of the paddle card, the cables being communicatively coupled to corresponding paddle card contacts, wherein the outer housing engages the pre-load latch to hold the cable assembly in a first position on the socket connector to pre-load the paddle card by a first holding force; and a spring plate coupled to the outer housing after the pre-load latch holds the cable assembly in the first position, the spring plate configured to be secured to the host circuit board to press the cable assembly downward toward the host circuit board to a second position, the deflectable spring beams of the socket contacts being further compressed from the first position to the second position.

11. The socket connector assembly of claim 10, wherein the spring plate is aligned with the paddle card.

12. The socket connector assembly of claim 10, wherein the spring plate includes a base, a first spring arm extending from the base to a first side of the outer housing, and a second spring arm extending from the base to a second side of the outer housing, the base being secured to a top of the outer housing, the first arm being secured to the host circuit board at the first side of the outer housing, the second arm being secured to the host circuit board at a second side of the outer housing, wherein the first and second spring arms spring bias the base downward to press the base against the top of the outer housing.

13. The socket connector assembly of claim 10, wherein the pre-load latch is coupled to the socket housing, the pre-load latch being secured to the host circuit board independent of the socket housing.

14. The socket connector assembly of claim 10, wherein the socket housing includes a locating feature extending from a top of the socket housing, the locating feature engaging the cable assembly to position the cable assembly relative to the socket connector.

15. The socket connector assembly of claim 14, wherein the locating feature includes outer housing posts extending from the top of the socket housing engaging the outer housing to locate the outer housing relative to the socket housing.

16. The socket connector assembly of claim 14, wherein the locating feature includes a paddle card post extending from a top of the socket housing being received in an opening in the paddle card to locate the paddle card relative to the socket housing.

17. A socket connector assembly for a communication system comprising:

a socket connector configured to be mounted to a host circuit board, the socket connector including a socket housing having a socket opening, the socket housing including a locating feature extending from a top of the socket housing, a bottom of the socket housing configured to be mounted to the host circuit board, the socket housing holding socket contacts, each socket contact including a deflectable spring beam having a separable mating interface;

a cable assembly coupled to the socket connector, the cable assembly including an outer housing having a paddle card pocket open at a bottom of the outer housing, the cable assembly including a paddle card received in the paddle card pocket, the paddle card extending between a mating end and a cable end, the paddle card having an upper paddle card surface and a lower paddle card surface, the paddle card including paddle card contacts at the mating end on the lower paddle card surface interfacing with the separable mating interfaces of the socket contacts when the cable assembly is coupled to the socket connector, the cable assembly including cables terminated to the paddle card at the cable end of the paddle card, the cables being communicatively coupled to corresponding paddle card contacts, wherein the cable assembly engages the locating feature to position the cable assembly relative to the socket connector; and a spring plate coupled to the outer housing, the spring plate configured to be secured to the host circuit board to press the cable assembly downward toward the host circuit board to compress the deflectable spring beams of the socket contacts.

18. The socket connector assembly of claim 17, wherein the socket connector includes a pre-load latch extending into the socket opening, the outer housing engaging the pre-load latch to hold the cable assembly in a first position on the socket connector to pre-load the paddle card by a first holding force, the spring plate being coupled to the host circuit board after the pre-load latch holds the cable assembly in the first position, the spring plate pressing the cable assembly downward toward the host circuit board to a second position, the deflectable spring beams of the socket contacts being further compressed in the second position compared to the first position.

19. The socket connector assembly of claim 17, wherein the locating feature includes outer housing posts extending from the top of the socket housing engaging the outer housing to locate the outer housing relative to the socket housing.

20. The socket connector assembly of claim 17, wherein the locating feature includes a paddle card post extending from a top of the socket housing being received in an opening in the paddle card to locate the paddle card relative to the socket housing.

21. The socket connector assembly of claim 1, wherein the at least one fastener is at least one threaded fastener.

* * * * *